United States Patent [19]

Uchida

[11] Patent Number: 4,532,607

[45] Date of Patent: Jul. 30, 1985

[54] PROGRAMMABLE CIRCUIT INCLUDING A LATCH TO STORE A FUSE'S STATE

[75] Inventor: Yukimasa Uchida, Yokohama, Japan

[73] Assignee: Tokyo Shibaura Denki Kabushiki Kaisha, Kawasaki, Japan

[21] Appl. No.: 398,925

[22] Filed: Jul. 16, 1982

[30] Foreign Application Priority Data

Jul. 22, 1981 [JP] Japan ............................... 56-114701
Dec. 25, 1981 [JP] Japan ............................... 56-209364

[51] Int. Cl.$^3$ ...................... G11C 11/34; G11C 17/00
[52] U.S. Cl. ..................................... 365/96; 365/200; 371/10
[58] Field of Search ..................... 365/96, 200; 357/86; 371/10; 307/594, 200 B, 279, 269

[56] References Cited

U.S. PATENT DOCUMENTS

| | | | |
|---|---|---|---|
| 3,870,901 | 3/1975 | Smith et al. | 365/229 |
| 3,917,960 | 11/1975 | Kane | 307/200 B |
| 3,950,654 | 4/1976 | Broedner et al. | 307/594 |
| 4,196,362 | 4/1980 | Maehashi | 307/594 |
| 4,267,466 | 5/1981 | Kung et al. | 307/279 |
| 4,281,398 | 7/1981 | McKenney et al. | 365/200 |
| 4,300,065 | 11/1981 | Remedi et al. | 307/594 |
| 4,346,459 | 8/1982 | Sud et al. | 371/10 |
| 4,385,245 | 5/1983 | Ulmer | 307/594 |
| 4,399,372 | 8/1983 | Tanimoto et al. | 365/96 |
| 4,446,534 | 5/1984 | Smith | 365/96 |

OTHER PUBLICATIONS

Kokkenen et al., "Redundancy Techniques for Fast Static RAMs", IEEE International Solid State Circuits Conference, 2-18-81, pp. 80-81.

Boggs et al., "Timing Circuits", IBM Technical Disclosure Bulletin, vol. 9, No. 12, May 1967, pp. 1795-1796.
Sakalay, "Correction of Bad Bits in a Memory Matrix", IBM Technical Disclosure Bulletin, vol. 6, No. 10, Mar. 1964, pp. 1-2.
Evans et al., "Correction of Memory with Defective Bits", IBM Technical Diclosure Bulletin, vol. 7, No. 6, Nov. 1964, pp. 436-437.
Tanimoto et al., German Offenlegungsschrift No. 3047186 believed published Sep. 10, 1981.
Stewart et al., "16K CMOS/SOS Asynchronous Static RAM", IEEE ISSCC, Feb. 15, 1979, 104-106.
Bindels et al., Cost-Effective Yield Improvement in Fault-Tolerant VLSI Memory, IEEE International Solid-State Circuits Conference, pp. 82-83, (Feb. 18, 1981).
Eaton, et al., A 100ns 64K Dynamic RAM using Redundancy Techniques, IEEE International Solid-State Circuits Conference, pp. 84-85, (Feb. 18, 1981).

Primary Examiner—Stuart N. Hecker
Assistant Examiner—Glenn A. Gossage
Attorney, Agent, or Firm—Finnegan, Henderson, Farabow, Garrett & Dunner

[57] ABSTRACT

A programmable circuit has a fuse element grounded at one end and melted or not melted according to the data to be programmed and a select circuit for selectively producing either of two signals according to "melted" or "not melted" states of the fuse element. The other end of the fuse element is connected through a switching element to the power source terminal, and through a latch circuit to the select circuit. By turning on the switching element at least one time, a level corresponding to a melted state of the fuse element is latched in the latch circuit.

12 Claims, 15 Drawing Figures

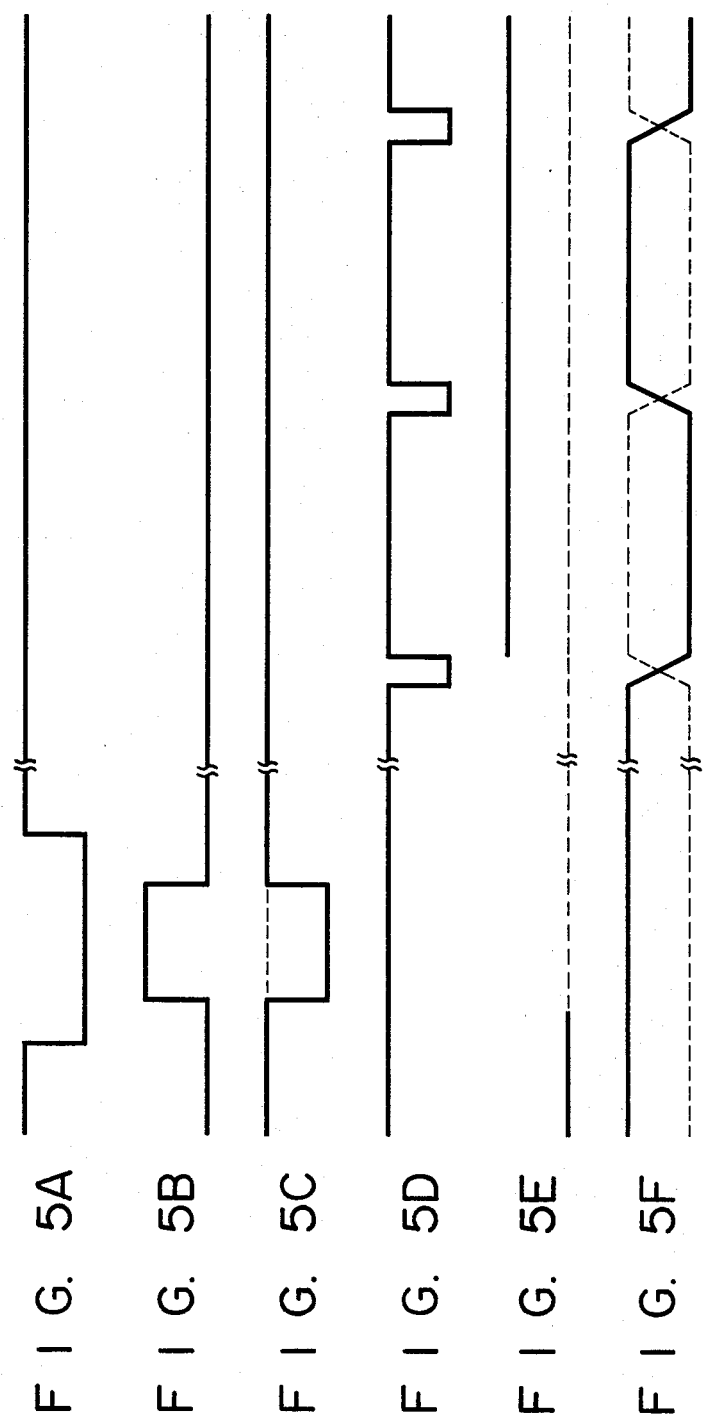

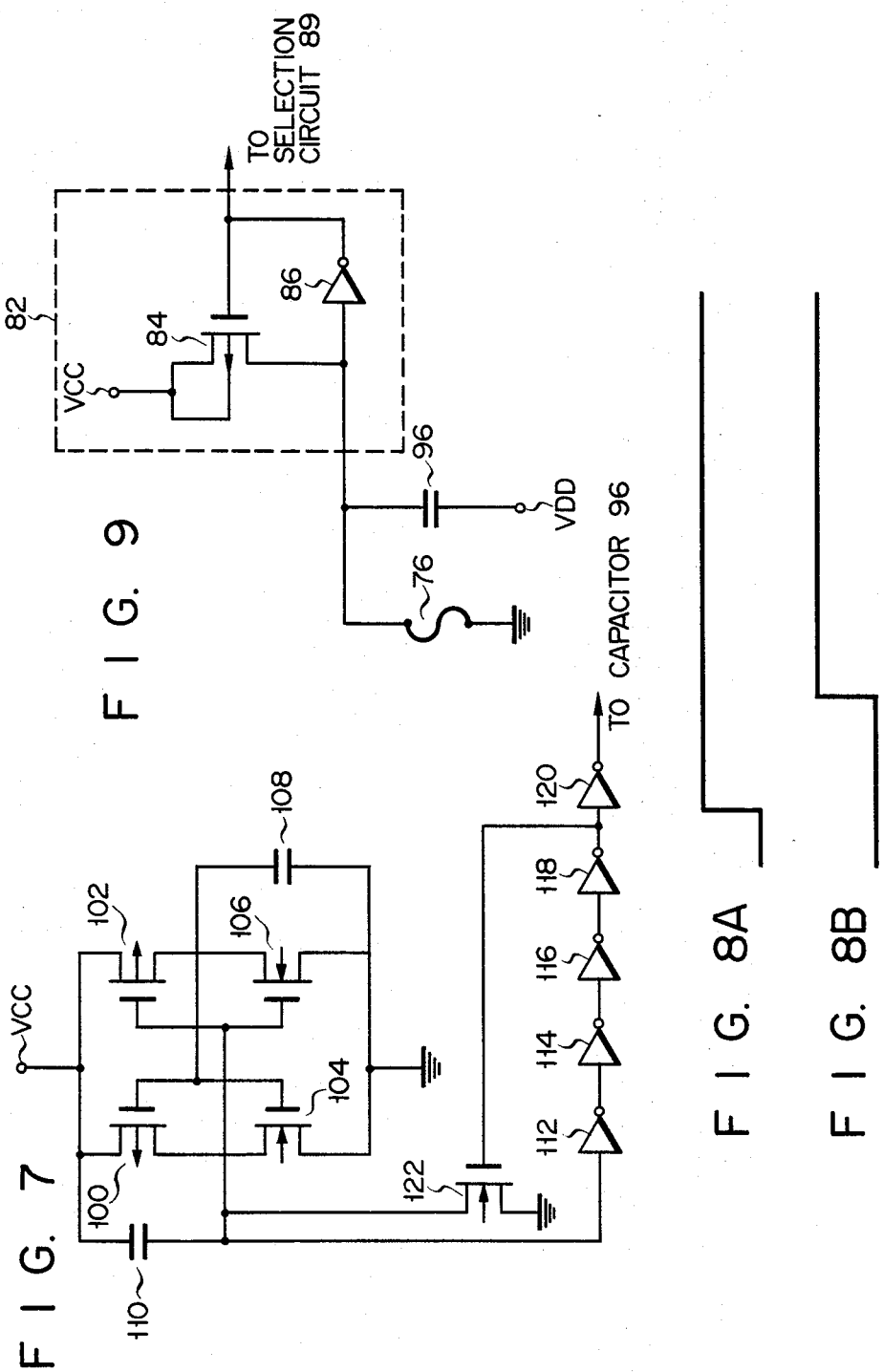

PROGRAMMABLE CIRCUIT INCLUDING A LATCH TO STORE A FUSE'S STATE

Background of the Invention

The present invention relates to programmable circuits and more particularly to a programmable circuit for use as a redundancy circuit in an LSI memory.

Recently, various types of LSI memories with an increased integration density have been developed. As a result of this development, the memory capacity of the LSI memories has been greatly increased; however, seldom do all of the elements formed on one chip operate normally. In this respect, the low production yield of the high integration density LSI chips is a great problem. To cope with the problem, a redundancy technique using a spare memory and a decoder, in addition to the normal memory cells and decoders has been employed. In the redundancy technique, defective bits are detected by testing the wafer. The addresses containing the defective bits are programmed in a programmable circuit. In response to the address signal corresponding to the defective bits, the normal decoder is inhibited, while the spare decoder is in an active state. Then, the memory cells containing the defective bits are replaced with the spare memory cells. The programmable circuit contains polysilicon fuses (referred to merely as fuses). The defective addresses are stored in the programmable circuit in the form of two states of the fuse, i.e. connect and melt. Kim Kokkonen et al. describes an example of the programmable circuit in their paper "Redundancy Techniques for Fast Static RAMs" 1981 ISSCC Digest of Technical papers, pp. 80 to 81, FIG. 2. In the aforesaid programmable circuit shown in FIG. 1 of the drawings, address signals X and $\overline{X}$ are applied through MOSFETs 10 and 12 to an address select signal $\overline{X}p$ line. In this example, all of the MOSFETs are of N-channel type and of the enhancement type so long as it is specifically referred to. The program signal $\overline{P}$ is supplied to the gate of a MOSFET 14. The MOSFET 14 is grounded at the drain, and connected at the source to the source of a MOSFET 16 and the gate of a MOSFET 18. The source of the MOSFET 14 is also connected to a high voltage source terminal VPP (e.g. 10 V) for programming, through a depletion type MOSFET 20 connected in a diode fashion. The MOSFET 16 is grounded at the drain and connected at the gate to the address signal $\overline{X}$ line. The MOSFET 18 is grounded at the drain and connected at the source to the gate of the MOSFET 12, connected through an inverter 22 to the gate of the MOSFET 10 and through a polysilicon fuse 24 to the power source terminal VCC (e.g. 5 V). The source of the MOSFET 18 is also grounded through a depletion type MOSFET 26 connected in a diode fashion.

In operation, the program signal $\overline{P}$ is normally at a logic "1" (5 V). When an address signal is programmed (written), it is changed to a logic "0" (0 V). When the program signal $\overline{P}$ is logic "0", the MOSFET 14 is OFF. The MOSFET 16 is OFF when the address signal $\overline{X}$ is at a logic "0" and ON when $\overline{X}$ is logic "1". When the MOSFET 16 is OFF, VPP (10 V) is applied to the gate of the MOSFET 18 through the MOSFET 20, so that the MOSFET 18 is ON. Then, current flows into the fuse 24, so that it is melted (blown). Conversely, when the MOSFET 16 is ON, the MOSFET 18 is OFF and the fuse 24 is not cut off.

The programming ends, and when the program signal $\overline{P}$ is logic, "1", the MOSFET 14 is ON. When the fuse 24 is not blown, the source of the MOSFET 18 is at 5 V, so that the MOSFET 10 is OFF but the MOSFET 12 is ON. As a result, the address signal $\overline{X}$ is produced as the address select signal $\overline{X}p$. On the other hand, when the fuse 24 is blown, the source of the MOSFET 18 is at 0 V, so that the MOSFET 10 is ON, but the MOSFET 12 is OFF. The result is that the address signal X is produced as the address select signal $\overline{X}p$. In this way, the fuse 24 is blown according to the defective address, and either of the signals X or $\overline{X}$ is produced as an address select signal $\overline{X}p$. In the programmable circuit shown in FIG. 1, however, the depletion type MOSFET 26 is inserted between a connection point between the fuse 24 and the MOSFET 18, and the ground terminal, for detecting a connection state of the fuse 24. Therefore, when the fuse 24 is not blown, DC current flows through the fuse 24 and the MOSFET 26. The consumption current is not a problem for the N-channel MOS memory which is capable of providing a large standby current. It is a problem for the CMOS memory which permits only several hundreds $\mu A$ or less for the standby current, however. Particularly, in the CMOS memory with a battery back up, the standby current must be below several tens of $\mu A$'s or less. This makes it impossible to save the defective bits by making use of the redundancy technique. Also in the general programmable circuit for writing a program for switching the function of the CMOS LSI, it was impossible to make the standby current small.

SUMMARY OF THE INVENTION

Accordingly, an object of the present invention is to provide a programmable circuit with a reduced consumption current.

The above object is achieved by a programmable circuit which comprises a fuse element having one end at a first potential which may be blown according to data to be programmed, a potential setting circuit for applying a second potential to the other end of the fuse element, and a circuit for producing the programmed data on the basis of the potential at the other end of the fuse element.

BRIEF DESCRIPTION OF THE DRAWINGS

FIGS. 5A to 5F show timing charts useful in explaining the operation of the programmable circuit of FIG. 1;

FIG. 7 is a circuit diagram of the timing signal generator of FIG. 6;

FIGS. 8A and 8B show timing charts for illustrating the operation of the second embodiment; and FIG. 9 is a circuit diagram of the main portion of another embodiment of the present invention.

DETAILED DESCRIPTION OF THE PREFERRED EMBODIMENTS

Figure 1:
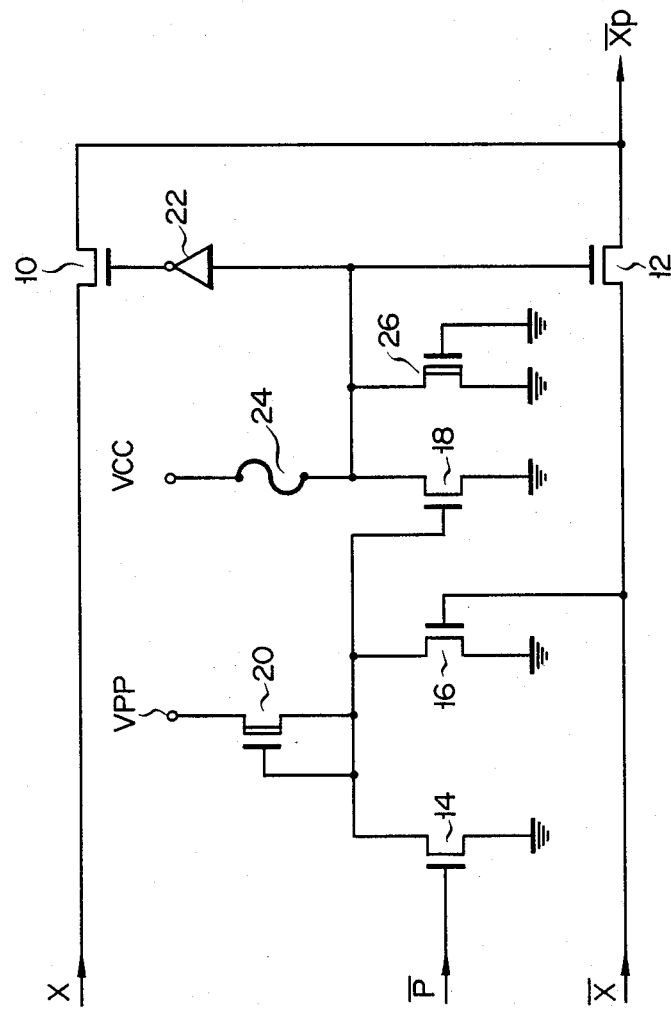
FIG. 1 shows a circuit diagram of a prior programmable circuit.
Figure 2:
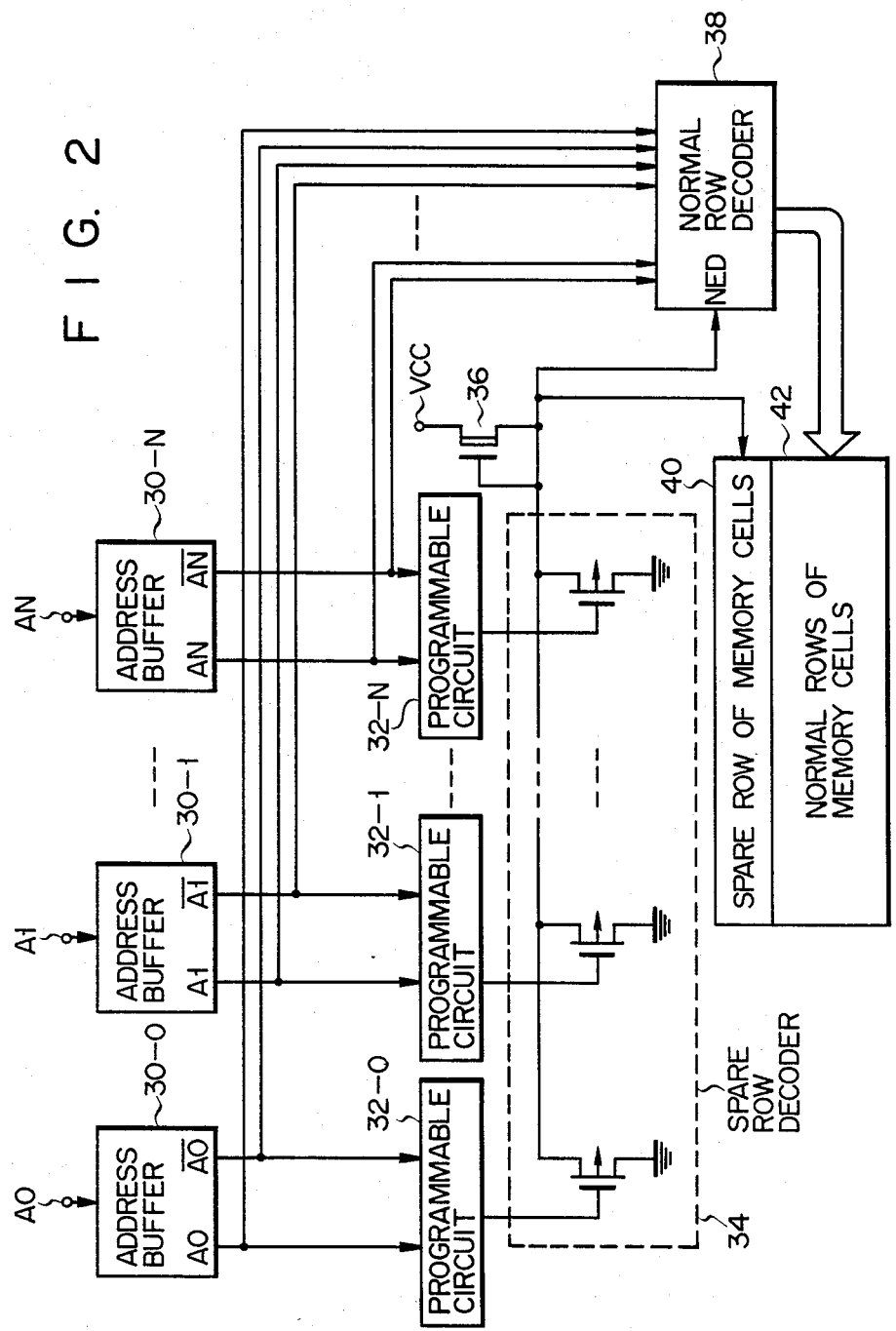
FIG. 2 is a block diagram of an overall LSI memory with a redundancy circuit.

An embodiment of a programmable circuit according to the present invention will be described referring to the accompanying drawings. FIG. 2 shows in block form an LSI memory capable of saving defective bits by using a redundancy technique involving the embodiment. The memory cell uses spare cells of one line other than the normal memory cells. Row address signals A0, A1, ... AN are supplied to address buffers 30-0, 30-1, ..., 30-N, respectively. The address buffers 30-0, 30-1, ..., 30-N produce an address true signal and an address complement signal. The output signals from the address buffers 30-0, 30-1, ..., 30-N are respectively supplied to programmable circuits 32-0, 32-1, ..., 32-N the output signals of which in turn are applied to a spare row decoder 34 as a NOR gate. The output signals from the spare row decoder 34 are coupled through a MOSFET 36 of the depletion type to a positive power source VCC. The output signals from the address buffers 30-0, 30-1, ..., 30-N are supplied to the input terminals of a normal row decoder 38. The output signal from the spare row decoder 34 is supplied to a normal element disable (NED) terminal of the normal row decoder 38. The output signals from the spare row decoder 34 and the normal row decoder 38 are supplied to a spare row 40 and normal rows 42, respectively. In such a memory device, after the wafer is tested, the row address containing the defective bits is written into the programmable circuits 32-0, 32-1, ..., 32-N. When receiving the row address signal, the normal row decoder 38 is disabled, while the spare row decoder 34 is enabled. As a result, the row containing the defective bits and the spare row are exchanged with each other, resulting in improvement of the production yield of the memories.

The programmable circuits 32-0, 32-1, ..., 32-N are identically arranged. One programmable circuit 32-i will be described in detail referring to FIG. 3. A row address signal Ai is applied to the address buffer 30-i. The address buffer 30-i is comprised of four inverters 50, 52, 54 and 56 connected in series, of which the inverters 54 and 56 of the third and fourth stages produce address complement signal $\overline{Ai}$ and address true signal Ai, respectively. The address true signal Ai is supplied to one end of the parallel connected P-channel MOSFET 58 and N-channel MOSFET 60. The address complement signal $\overline{Ai}$ is coupled with one end of the parallel connected N-channel MOSFET 62 and P-channel MOSFET 64. The other ends of the two parallel circuits are connected together. An output signal Xi of the programmable circuit 32-i is derived from the connection point of the two parallel circuit. The output signal Ai from the inverter 52 of the second stage in the address buffer 30-i is supplied to the gate of a P-channel MOSFET 66. The source and drain of the MOSFET 66 are respectively connected to the source and drain of a P-channel MOSFET 68. The power source terminal VCC is connected to the sources of the MOSFETs 66 and 68. A program signal PR to be described later is applied to the gate of the MOSFET 68. The program voltage signal VPP is applied through a resistor 70 to the drains of the MOSFETs 66 and 68 and the gate of a P-channel MOSFET 72. The MOSFETs 66, 68, 72, and the resistor 70 make up a program circuit 74. The source and the back-gate of the MOSFET 72 are connected to the power source terminal VCC and the drain of it is grounded through a polysilicon fuse 76 and connected to the power source terminal VCC through a P-channel MOSFET 78. A timing signal generator 80 to be described later is connected to the gate of the MOSFET 78. The drain of the MOSFET 72 is also connected to the input terminal of a feedback type latch circuit 82. The latch circuit 82, is comprised of a P-channel MOSFET 84 and an inverter 86 which level-inverts the signal at the drain of the MOSFET 84 and applies it to the gate thereof. The input and output terminals of the inverter 86 serve as the input and output terminals of the latch circuit 82, respectively. The source and back-gate of the MOSFET 84 are connected to the power source terminal VCC. The output signal from the latch circuit 82, i.e. the output signal from the inverter 86, is connected to the respective gates of the MOSFETs 58 and 62, and through the inverter 88 to the respective gates of the MOSFETs 60 and 64. The MOSFETs 58, 60, 62 and 64 and the inverter 88 make up a select circuit 89 for producing either of the signals Ai and $\overline{Ai}$ as the select output signal Xi.

Figure 3:
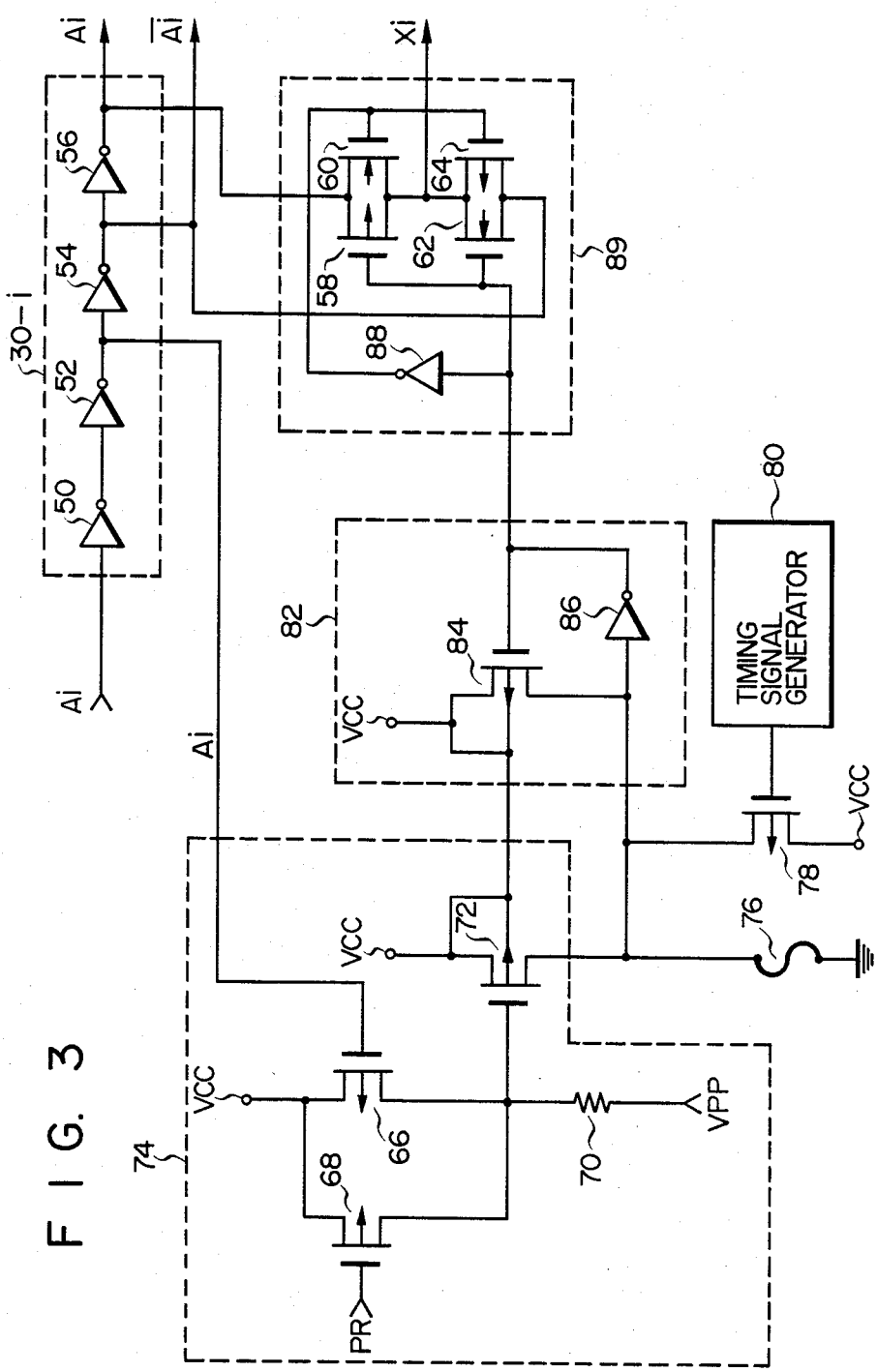
FIG. 3 is a circuit diagram of one embodiment of a programmable circuit, in the redundancy circuit shown in FIG. 2 according to this invention.
Figure 4:
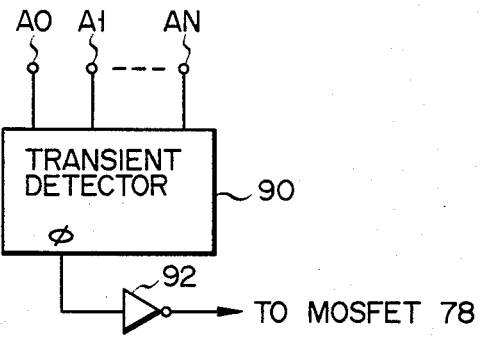
FIG. 4 is a circuit diagram of a timing signal generator of FIG. 3.

FIG. 4 shows an arrangement of the timing signal generator 80 of FIG. 3. An output signal $\phi$ of a transient detector 90 coupled at the input with the row address signals A0, A1, ..., AN is applied as a timing signal to the gate of the MOSFET 78 via the inverter 92. Circuit 90 may include, for example, an edge-detecting network such as a differentiator and a pulse shaping network, such as a monostable multivibrator for supplying a pulse to MOSFET 78.

The operation of the first embodiment of the programmable circuit will now be described referring to FIG. 3 and to the timing charts shown in FIGS. 5A to 5F. When the power source VCC is applied to the overall circuit, the program power source VPP is high in level (+10 V), as shown in FIG. 5A. The program signal PR is low in level as shown in FIG. 5B and the MOSFET 68 is ON. As a result, the gate level of the MOSFET 72 is high as shown in FIG. 5C and the MOSFET 72 is OFF. Since the output signal level of the timing signal generator 80 is high as shown in FIG. 5D, the MOSFET 78 is OFF and the input signal of the latch circuit 82 is low in level, as shown in FIG. 5E. The program of the address signal will be described assuming that the row address signal supplied to the circuit indicates the row of the cells containing defective bits. The program power source VPP is made low in level (−10 V) as shown in FIG. 5A and then the program signal PR is made high in level, as shown in FIG. 5B. As a result, the MOSFET 68 is OFF. The MOSFET 66 is OFF when the address signal Ai is high in level and ON when it is low in level. For this reason, the gate of the MOSFET 72 is low in level by VPP, as indicated by a solid line in FIG. 5C when the address signal Ai is high in level. When the address signal Ai is low in level, the gate of the MOSFET 72 is high in level as indicated by a broken line in FIG. 5C. As a result, when the address signal Ai is high in level, the MOSFET 72 is turned on and a large current of approximately 10 mA is fed to the fuse 76, so that the fuse 76 is melted. At this time, the input level of the latch circuit 82 is unstable. When the address signal Ai is low in level, the MOSFET 72 is turned off, and the fuse 76 is not melted. Thus, the input signal of the latch circuit 82 is low in level as indicated by a broken line in FIG. 5E. In this way, the high level and low level address signals are written into the programmable circuit in the form of "melted" or "not melted" of the fuse 76, respectively.

In this way, the program of the defective address is finished, and then the program signal PR is made low in level, as shown in FIG. 5B. The gate of the MOSFET 72 is high in level irrespective of the level of the address signal Ai, as shown in FIG. 5C. As a result, the MOSFET 72 is turned off and the input level of the latch circuit 82 is instable if the address signal Ai is high. If the address signal Ai is low in level, (it is low as indicated by a broken line in FIG. 5E), then the program power source VPP returns to the high level, as shown in FIG. 5A. FIG. 5F shows an address signal Ai. The description up to this point has been for the operation of the program mode.

Generally, the program mode follows the test on the wafer of the LSI. Then, the memory chip is cut from the wafer. For this reason, the power source is shut off temporarily. After the memory is mounted into the package and the normal read and write operations are performed, the power source is turned on again. The input to the latch circuit 82 is low in level, as shown in FIG. 5E, when the fuse 76 is connected, i.e. when the address signal Ai at low level is programmed. When the fuse is blown, i.e., when the high level address signal Ai is programmed, the input level of the latch circuit 82 is instable. When either of the address signals A0 to AN changes, the output signal from the timing signal generator 80 is low in level for a given period, as shown in FIG. 5D. With the low level timing signal, the MOSFET 78 is ON. When the MOSFET 78 is ON, the input of the latch circuit 82 is high in level, as indicated by a solid line in FIG. 5E if the fuse 76 is melted. If it is not melted, the input signal is low in level, as indicated by a broken line in FIG. 5E. The latch circuit 82 maintains the input level as it is even if the output signal from the timing signal generator 80 is returned to high level. When the input signal to the latch circuit 82 is high, the MOSFETs 58 and 60 are ON and the address true signal Ai is produced as the output signal Xi. Conversely, when the input signal of the latch circuit 82 is low, the MOSFETs 62 and 64 are ON and the address complement signal $\overline{Ai}$ is produced as the select output signal Xi.

In this way, according to the present embodiment, when the fuse 76 is melted, the select output signal Xi is always the address true signal Ai. If it is not melted, the select output signal Xi is always the address complement signal $\overline{Ai}$. The state of the fuse 76 is detected in a manner that the MOSFET 78 as a switching element and the fuse 76 are connected in series between the first and second power sources (VCC and ground) and the MOSFET 78 is selectively turned on. Therefore, when the MOSFET 78 is OFF, i.e. in a standby state, the consumption current does not flow. The ON state of the MOSFET 78 continues for a short period when the address signal changes, but the consumption current is negligible. The inverter in the address buffer 30-i also has no current flow in the standby state. Therefore, the programmable circuit may be used for a CMOS circuit, thus improving the production yield of the chips. This is preferable for use with the CMOS memory with a back up battery. The read out of the program data, i.e., turning on of the MOSFET 78, is performed in synchronism with a change of the address signal. Therefore, the read out data are insensitive to the power source noise. Further, in some instances a leak current flows into the melted fuse 76. However, the input level of the latch circuit 82 is unconditionally determined by the amplitude of the currents flowing into the fuse 76 when the MOSFET 78 is turned ON and turned OFF.

Figure 6:
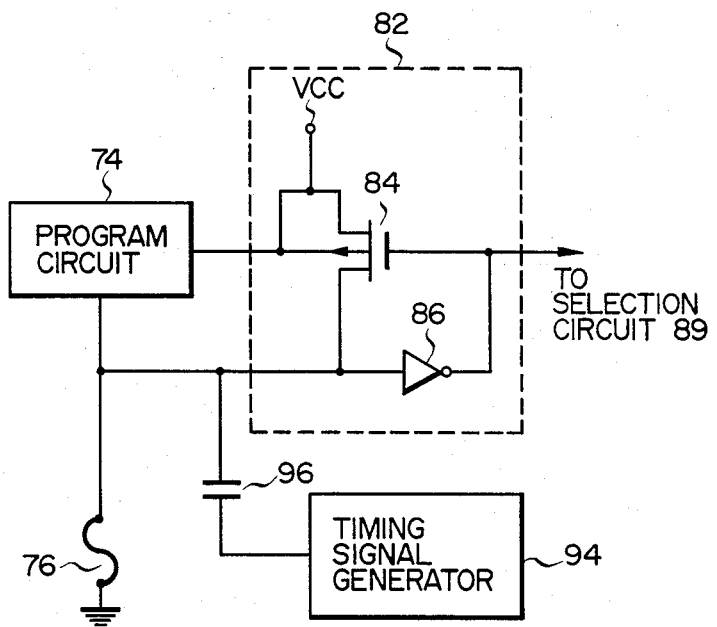
FIG. 6 is a circuit diagram of the main portion of a second embodiment of the programmable circuit according to this invention.

A second embodiment of a programmable circuit according to the present invention will be described. In the second embodiment, a capacitor is used in place of the MOSFET 78 connected in series with the fuse 76 in the first embodiment. The main part of the second embodiment is shown in FIG. 6. Same reference numerals are used for designating like or the same portions in FIG. 3. The output signal from a timing signal generator 94 is supplied to the connection point of a fuse 76 and latch circuit 82, through a capacitor 96. Referring to FIG. 7, the timing signal generator 94 is a power ON detector comprised of P-channel MOSFETs 100 and 102 and N-channel MOSFETs 104 and 106 connected between the power source terminal VCC and ground, a capacitor 108 connected between the ground and the gates of the MOSFETs 100 and 104, and a capacitor 110 between the power source terminal VCC and the gates of the MOSFETs 102 and 106. The gates of the MOSFETs 102 and 106 are connected to a capacitor 96 through inverters 112, 114, 116, 118 and 120 in series. An N-channel MOSFET 122 is connected between the input terminal of the inverter 112 and ground and the output terminal of the inverter 118 is connected to the gate of the MOSFET 122. The remaining arrangement of the second embodiment is the same as the corresponding one of the first embodiment.

The operation of the second embodiment will be described. The program mode for writing an address signal is the same as that of the first embodiment. Upon lapse of a predetermined time after the power source VCC is turned on in the normal read and write operations, as shown in FIG. 8A, the level at the output terminal of the timing signal generator 94 changes from 0 level to the power source VCC level (+5 V), as shown in FIG. 8B. Assuming that the capacitance of the capacitor 96 is CE, and the stray capacitance is CS, a voltage of (CE/(CE+CS))×5 V appears across the capacitor 96. If the stray capacitance CS is extremely smaller than the capacitance CE, the voltage across the capacitor 96 is almost 5 V. If the fuse 76 is melted, the input signal of the latch circuit 82 is high in level. If the fuse 76 is not melted, the capacitor voltage is discharged through the fuse 76, so that the input signal of the latch circuit 82 is low in level. This is the same as that of the first embodiment. Accordingly, it is seen that the written data is correctly read out. Although 5 V is always applied to the capacitor 96, no current flows through the fuse 86 after the discharge of the charged voltage in the capacitor 96 terminates and the connection point between the capacitor 96 and the fuse 76 is set to low level (0 V) by the action of the latch circuit 82.

As described above, also in the second embodiment, less power is consumed. Accordingly, the programmable circuit suitable for the redundancy circuit of the CMOS memory is obtained. Also in the present embodiment, the influence of the leak current of the melted fuse upon the input level to the latch circuit 82 is made negligible by the capacitance CE of the capacitor 96 and a slope of the rise of the timing signal.

The present invention is not limited to the above-mentioned embodiments, but may variously be modified. For example, the power ON detector may be used for the timing signal generator of the first embodiment, or the signal generator synchronized with the change of the address signal as in the first embodiment, may be used for the timing signal generator of the second embodiment. The timing signal may be such a signal as to detect the state of the fuse at least one time. Further, the chip select signal may be used. Additionally, a combination of these signals may be formed. The writing of the program into the fuses may be made by not only the electrical means but a laser beam means for cutting the fuses. In the second embodiment, the capacitor 96 may be connected to the power source terminal VDD at the terminal opposite to the fuse 76, as shown in FIG. 9. The power source voltage VDD may be equal to or not to VCC. The power source VDD is turned on in the normal read out and write operations. In FIG. 9, the fuse 76 is cut off by the laser beam. The programmable circuit is applicable not only for the defective cell saving circuit of the LSI memory, but also for a circuit for selecting one circuit from those integrated on a chip by using the fuse elements, and other suitable circuits.

What is claimed is:

1. A programmable circuit comprising:
   fuse means set at a first potential at one end, which is blown according to address data to be programmed;
   potential setting means for supplying a pulse signal of a second potential to the other end of said fuse means; and
   feedback type latch means responsive to said pulse signal for latching a voltage across said fuse means to provide a read-out of said address data.

2. A programmable circuit according to claim 1, wherein said potential setting means includes a MOSFET connected between said other end of said fuse means and a second potential terminal, and a signal generator connected to the gate of said MOSFET for selectively producing a timing signal to turn on said MOSFET.

3. A programmable circuit according to claim 2, wherein said fuse means is blown according to the address data containing defective bits of a memory, the output signal from said latch means is supplied to a spare address decoder of said memory, and said signal generator produces a timing signal in synchronism with a change of an address signal of said memory.

4. A programmable circuit according to claim 2, wherein said signal generator produces a timing signal when a main power source is turned ON.

5. A programmable circuit according to claim 1, wherein said potential setting means is a circuit for supplying the second potential through a capacitor to said other end of said fuse element.

6. A programmable circuit according to claim 5, wherein said fuse means is blown according to the address data containing the defective bits of a memory, the output signal from said latch means is supplied to a spare address decoder of said memory, and said potential setting means includes means for supplying said second potential in synchronism with a change of an address signal of said memory.

7. A programmable circuit according to claim 5, wherein said potential setting means includes means for supplying said second potential when a main power source is turned ON.

8. A programmable circuit according to claim 1, wherein said potential setting means includes a second potential terminal connected through a capacitor to said other end of said fuse element.

9. A programmable memory for storing address data in a spare memory decoder operable for decoding address signals applied to a semiconductor memory system comprising:
   programmable nonvolatile memory means for storing Permanent address data;
   semiconductor latch means coupled to said nonvolatile memory means for storing binary data for decoding said applied address signals; and
   enabling means for periodically enabling said latch means to store said permanent address data.

10. The programmable memory set forth in claim 9 wherein said enabling means includes means for enabling said latch means in response to the application of said address signals.

11. The programmable memory set forth in claim 9 wherein said system includes a main power source and wherein said enabling means includes means for enabling said latch means in response to the activation of said main power source.

12. The programmable memory set forth in claim 9 further comprising means for programming said nonvolatile memory means by modifying said means to permanently store address data representing the address of a memory location within said semiconductor memory system which has been determined to include defective memory components.

* * * * *